US012804991B2

(12) United States Patent
Kono

(10) Patent No.: US 12,804,991 B2
(45) Date of Patent: Nov. 17, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 568 days.

(21) Appl. No.: 17/891,671

(22) Filed: Aug. 19, 2022

(65) Prior Publication Data

US 2023/0307519 A1 Sep. 28, 2023

(30) Foreign Application Priority Data

Mar. 23, 2022 (JP) ................................ 2022-047267

(51) Int. Cl.
*H10D 62/17* (2025.01)
*H10D 30/67* (2025.01)
(Continued)

(52) U.S. Cl.
CPC ....... *H10D 64/514* (2025.01); *H10D 30/6739* (2025.01); *H10D 62/299* (2025.01); *H10D 62/393* (2025.01); *H10D 62/8325* (2025.01)

(58) Field of Classification Search
None
See application file for complete search history.

(56) References Cited

U.S. PATENT DOCUMENTS 5,744,826 A * 4/1998 Takeuchi ............ H10D 12/031 257/77
5,976,936 A 11/1999 Miyajima et al.
(Continued)

FOREIGN PATENT DOCUMENTS

CN 113557607 A 10/2021
JP H0974191 A 3/1997
(Continued)

OTHER PUBLICATIONS

Notice of Reasons for Refusal (Office Action) mailed Mar. 24, 2025 in corresponding Japanese Patent Application No. 2022-047267 with English machine translation, 15 pages.
(Continued)

*Primary Examiner* — Sue A Purvis
*Assistant Examiner* — Carnell Hunter, III
(74) *Attorney, Agent, or Firm* — Kim & Stewart LLP

(57) ABSTRACT

A semiconductor device includes a first electrode, a first semiconductor layer, a second semiconductor layer, a third semiconductor layer, a second electrode, a third electrode, and a fourth semiconductor layer. The third electrode is located among the first semiconductor layer, the second semiconductor layer, and the third semiconductor layer via an insulating film. The fourth semiconductor layer is located between the insulating film and the first semiconductor layer and between the insulating film and the second semiconductor layer. An impurity concentration of the fourth semiconductor layer is less than an impurity concentration of the first semiconductor layer and an impurity concentration of the second semiconductor layer.

18 Claims, 12 Drawing Sheets

(51) Int. Cl.

| | |
|---|---|
| ***H10D 62/832*** | (2025.01) |
| ***H10D 64/27*** | (2025.01) |

(56) References Cited

U.S. PATENT DOCUMENTS

| | | | | |
|---|---|---|---|---|
| 2009/0200559 | A1* | 8/2009 | Suzuki ............... | H10D 30/0297 257/77 |
| 2009/0261350 | A1 | 10/2009 | Yamamoto et al. | |
| 2009/0311839 | A1* | 12/2009 | Miyahara .......... | H01L 29/66068 438/270 |
| 2016/0351680 | A1 | 12/2016 | Soeno et al. | |
| 2017/0271437 | A1 | 9/2017 | Kono et al. | |
| 2018/0090612 | A1* | 3/2018 | Fujiwara .............. | H10D 30/658 |
| 2018/0175147 | A1* | 6/2018 | Ohse .................... | H10D 30/668 |
| 2019/0348524 | A1 | 11/2019 | Ebiike et al. | |
| 2020/0194554 | A1 | 6/2020 | Adachi et al. | |
| 2020/0203482 | A1* | 6/2020 | Kaji ................... | H10D 62/8325 |
| 2021/0043765 | A1 | 2/2021 | Tanaka et al. | |
| 2021/0296435 | A1 | 9/2021 | Kumagai | |
| 2022/0102503 | A1 | 3/2022 | Hatta et al. | |

FOREIGN PATENT DOCUMENTS

| | | | | |
|---|---|---|---|---|
| JP | 2001077358 | A | 3/2001 | |
| JP | 2007281265 | A | 10/2007 | |
| JP | 2009260064 | A | 11/2009 | |
| JP | 2015141919 | A | 8/2015 | |
| JP | 2015153948 | A | 8/2015 | |
| JP | 2018101706 | A | 6/2018 | |
| JP | 6416143 | B2 | 10/2018 | |
| JP | 2019-197792 | A | 11/2019 | |
| JP | 6903222 | B2 | 7/2021 | |
| JP | 2021-150405 | A | 9/2021 | |
| WO | 2018/163593 | A1 | 9/2018 | |
| WO | WO-2020188686 | A1 * | 9/2020 | ........... H01L 21/047 |
| WO | 2019/186785 | A1 | 12/2020 | |

OTHER PUBLICATIONS

First Office Action dated Jun. 16, 2026, mailed in counterpart Chinese Patent Application No. 202210817553.0, with English machine translation, 21 pages.

* cited by examiner

OFF-STATE

ON-STATE

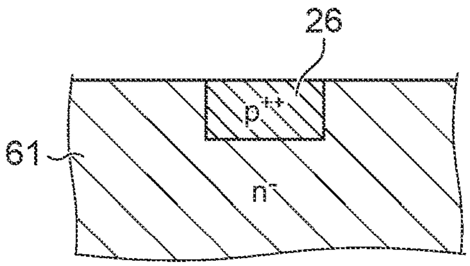
FIG. 3A
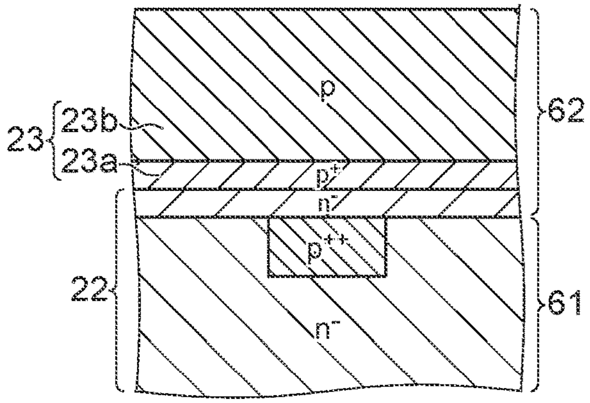
FIG. 3B
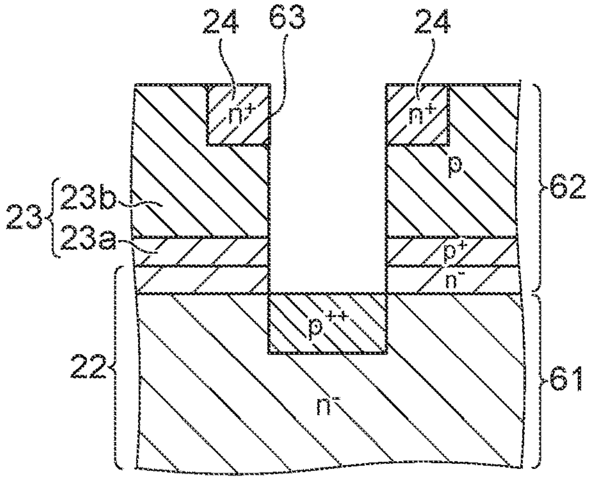
FIG. 3C
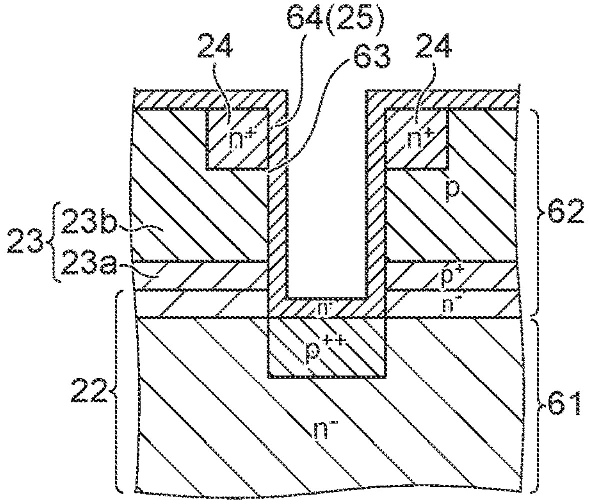
FIG. 3D
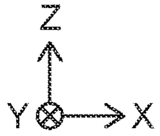

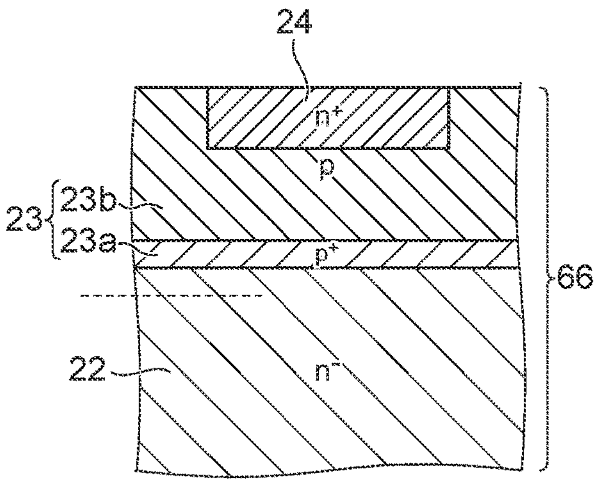
FIG. 4A
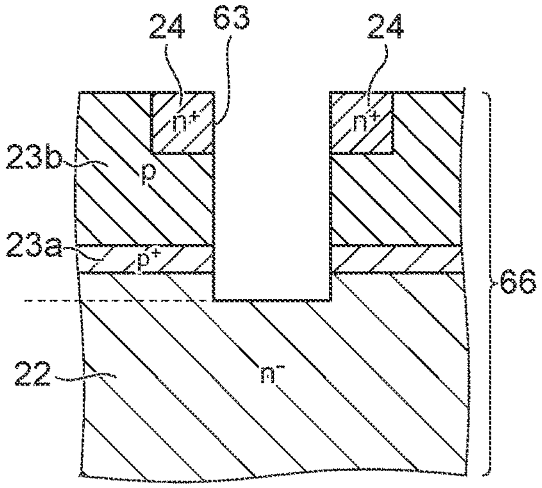
FIG. 4B
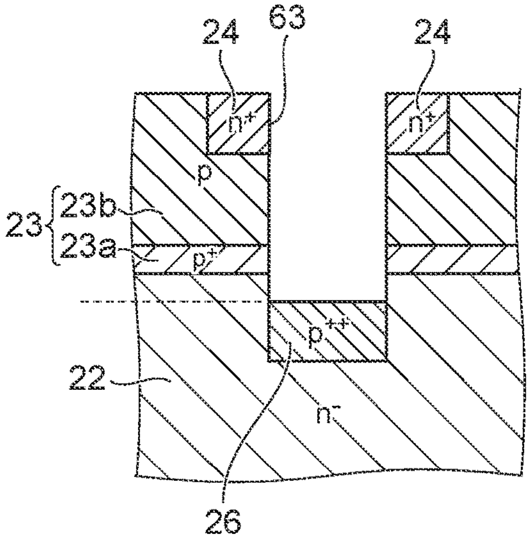
FIG. 4C
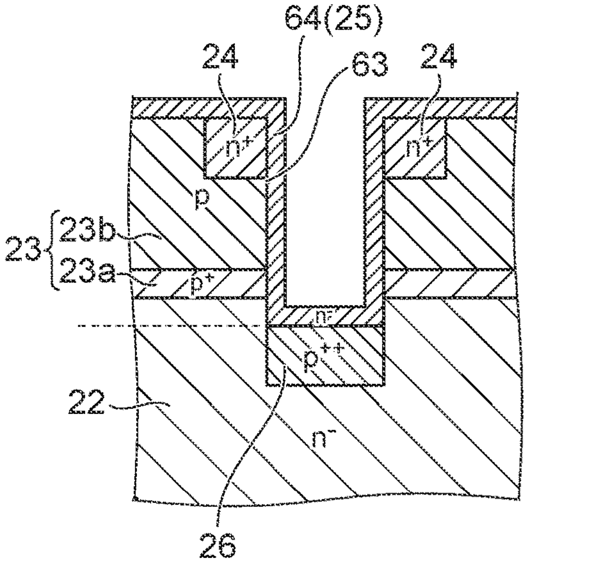
FIG. 4D
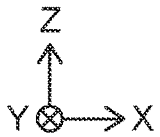

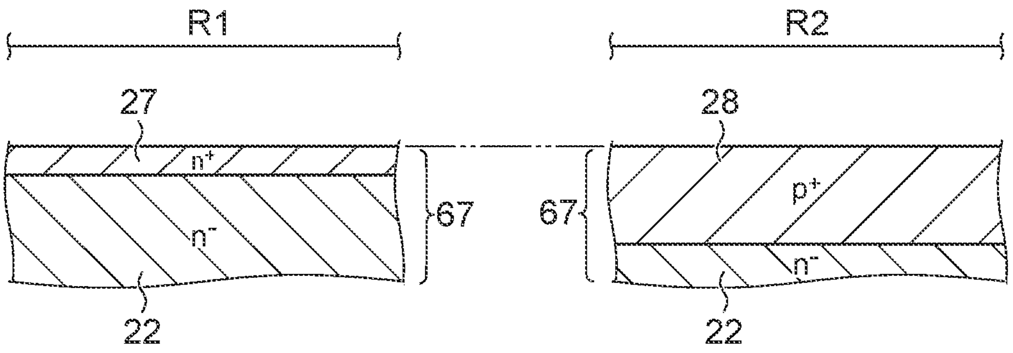
FIG. 8A
FIG. 8B
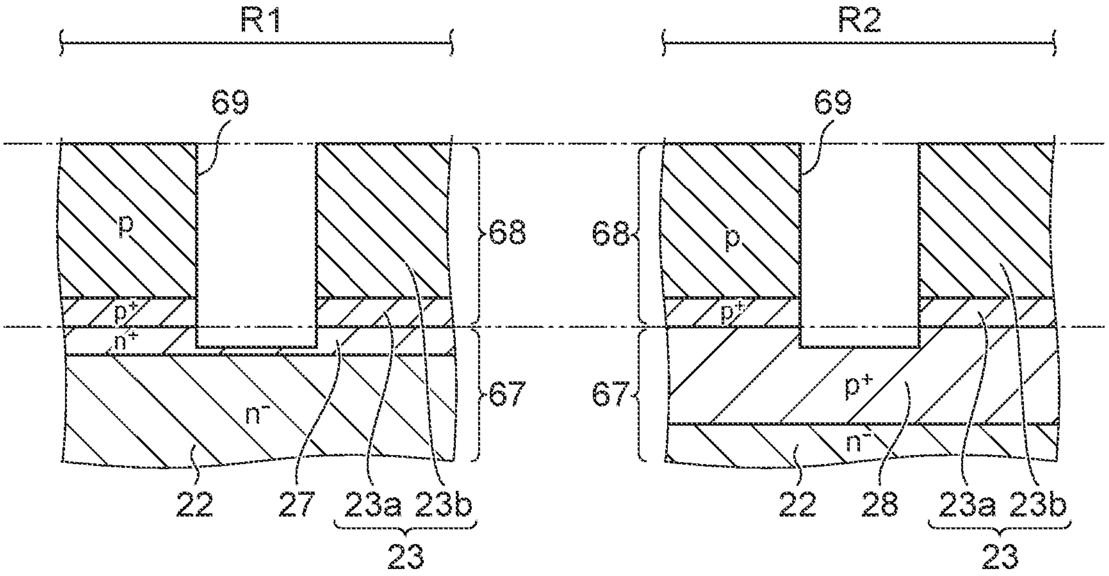
FIG. 8C
FIG. 8D
Z
Y
X

SEMICONDUCTOR DEVICE

CROSS-REFERENCE TO RELATED APPLICATIONS

This application is based upon and claims the benefit of priority from Japanese Patent Application No. 2022-047267, filed on Mar. 23, 2022; the entire contents of which are incorporated herein by reference.

FIELD

Embodiments relate to a semiconductor device.

BACKGROUND

Power semiconductor devices that use silicon carbide instead of silicon are being developed. Compared to a semiconductor device that uses silicon, a semiconductor device that uses silicon carbide can improve the balance between the breakdown voltage and the on-resistance by withstanding a strong electric field. However, increasing the electric field in silicon carbide also increases the electric field applied to the gate insulating film and reduces the reliability of the gate insulating film.

BRIEF DESCRIPTION OF THE DRAWINGS

FIGS. 3A to 3D show a first manufacturing method of the semiconductor device according to the first embodiment;

FIGS. 4A to 4D show a second manufacturing method of the semiconductor device according to the first embodiment;

FIGS. 8A to 8D show a manufacturing method of the semiconductor device according to the third embodiment;

DETAILED DESCRIPTION

In general, according to one embodiment, a semiconductor device includes a first electrode, a first semiconductor layer, a second semiconductor layer, a third semiconductor layer, a second electrode, a third electrode, and a fourth semiconductor layer. The first semiconductor layer is connected to the first electrode. The first semiconductor layer includes silicon carbide. The first semiconductor layer is of a first conductivity type. The second semiconductor layer is located on the first semiconductor layer. The second semiconductor layer includes silicon carbide. The second semiconductor layer is of a second conductivity type. The third semiconductor layer is located on a portion of the second semiconductor layer. The third semiconductor layer includes silicon carbide. The third semiconductor layer is of the first conductivity type. The second electrode is connected to the second and third semiconductor layers. The third electrode is located among the first semiconductor layer, the second semiconductor layer, and the third semiconductor layer via an insulating film. The fourth semiconductor layer is located between the insulating film and the first semiconductor layer and between the insulating film and the second semiconductor layer. The fourth semiconductor layer contacts the insulating film and includes silicon carbide. An impurity concentration of the fourth semiconductor layer is less than an impurity concentration of the first semiconductor layer and an impurity concentration of the second semiconductor layer.

First Embodiment

Figure 1:
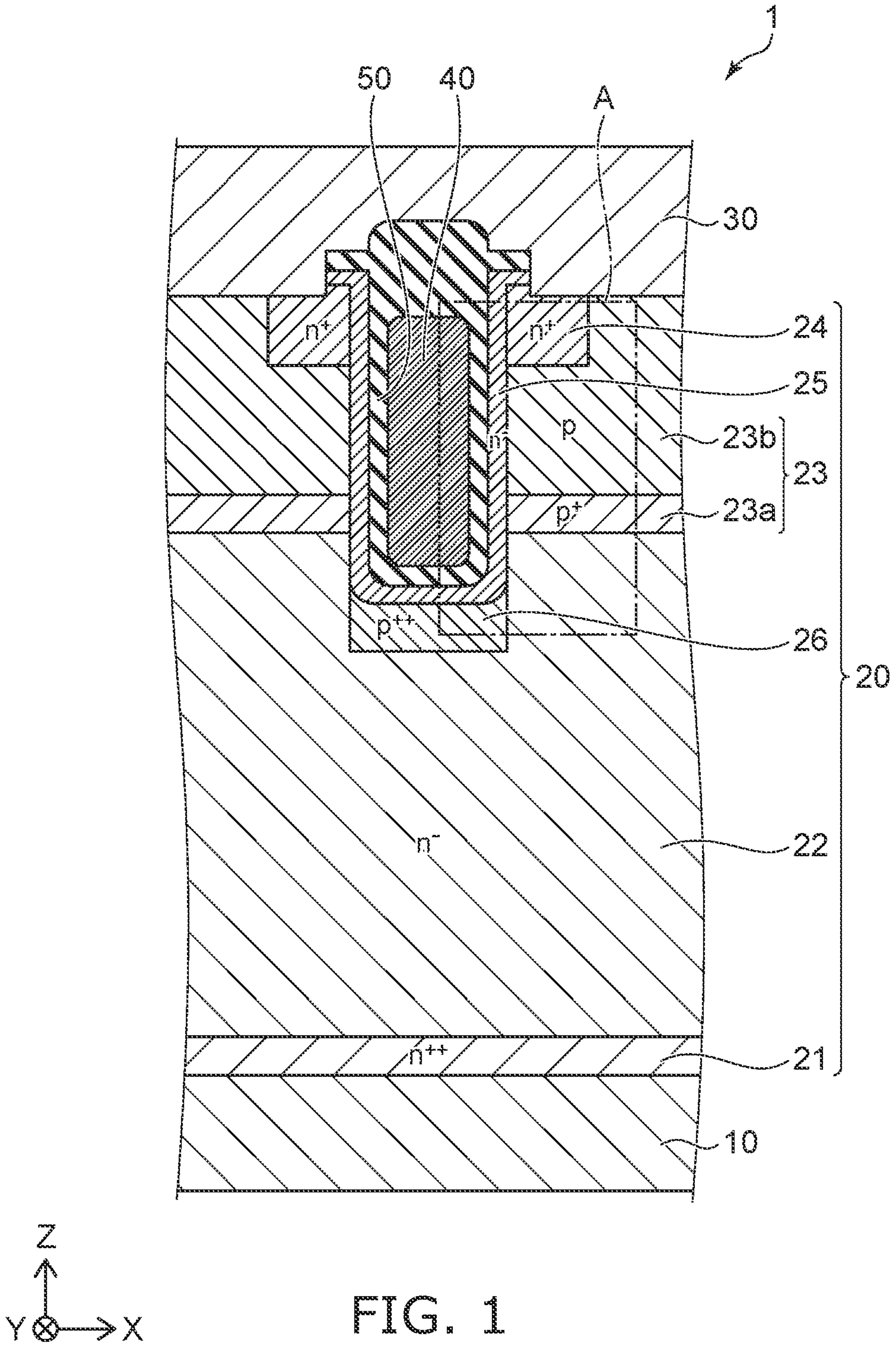
FIG. 1 is a cross-sectional view showing a semiconductor device according to a first embodiment.

FIG. 1 is a cross-sectional view showing a semiconductor device according to the embodiment.

The drawings are schematic and simplified as appropriate. This is similar for the other drawings described below as well. The dimensional ratios of the components do not necessarily match exactly between the drawings.

As shown in FIG. 1, the semiconductor device 1 according to the embodiment is a trench-gate MOSFET (Metal-Oxide-Semiconductor Field-Effect Transistor). The semiconductor device 1 includes a drain electrode 10 (a first electrode), a semiconductor part 20, a source electrode 30 (a second electrode), a gate electrode 40 (a third electrode), and a gate insulating film 50 (an insulating film).

An XYZ orthogonal coordinate system is employed for convenience of description in the specification hereinbelow. A direction connecting the drain electrode 10 and the source electrode 30 is taken as a "Z-direction"; the direction in which the gate electrode 40 extends is taken as a "Y-direction"; and a direction orthogonal to the Z-direction and the Y-direction is taken as an "X-direction". Among the Z-directions, a direction that is from the drain electrode 10 toward the source electrode 30 also is called "up", and the opposite direction also is called "down"; however, these expressions are for convenience and are independent of the direction of gravity.

The drain electrode 10 and the source electrode 30 have plate shapes spreading along the XY plane. The semiconductor part 20 is located on the drain electrode 10. The source electrode 30 is located on the semiconductor part 20. The gate electrode 40 is located inside the semiconductor part 20. Multiple gate electrodes 40 are arranged along the X-direction. The gate electrodes 40 extend in the Y-direction. The gate electrodes 40 are connected to a gate pad (not illustrated) located on the semiconductor part 20; and a voltage is applied to the gate electrodes 40 from the gate pad. The gate insulating film 50 is located between the gate electrode 40 and the semiconductor part 20 and insulates the gate electrode 40 from the semiconductor part 20.

The semiconductor part 20 includes silicon carbide (SiC) and is made of, for example, a single crystal of silicon carbide. The conductivity type of each portion of the semiconductor part 20 is set to an n-type or a p-type by locally introducing an impurity that forms donors or acceptors. The impurity that forms donors is, for example, nitrogen (N); and the impurity that forms acceptors is, for example, aluminum (Al) or boron (B). The gate insulating film 50 includes silicon oxide (SiO).

The semiconductor part 20 includes a drain layer 21 (a first layer), a drift layer 22 (a second layer), a base layer 23 (a second semiconductor layer), a source layer 24 (a third semiconductor layer), a low-concentration layer 25 (a fourth semiconductor layer), and a buried p-type layer 26 (a fifth semiconductor layer). For example, the conductivity type of the drain layer 21 is the $n^{++}$-type. The conductivity type of the drift layer 22 is the $n^{-}$-type. The conductivity type of the base layer 23 is the p-type. The conductivity type of the source layer 24 is the $n^{+}$-type. The conductivity type of the low-concentration layer 25 is the $n^{-}$-type. The conductivity type of the buried p-type layer 26 is the $p^{++}$-type.

The superscript symbols attached to the characters "n" and "p" representing the conductivity types indicate relative levels of the impurity concentrations. For the n-type, the impurity concentration in decreasing order is "$n^{++}$-type", "$n^{+}$-type", "n-type", and "$n^{-}$-type". This is similar for the p-type as well. In the specification, the "impurity concentration" refers to the effective impurity concentration contributing to the conduction of the semiconductor, and refers to the concentration excluding the cancelled portion when one region includes both an impurity that forms donors and an impurity that forms acceptors.

The $n^{++}$-type drain layer 21 is located on the drain electrode 10, contacts the drain electrode 10, and is connected to the drain electrode 10. In the specification, "connected" refers to an electrical connection. The $n^{-}$-type drift layer 22 is located on the drain layer 21, contacts the drain layer 21, and is connected to the drain layer 21. The impurity concentration of the drift layer 22 is less than the impurity concentration of the drain layer 21. Although the first semiconductor layer includes the drain layer 21 and the drift layer 22, the first semiconductor layer may include only the drift layer 22.

The p-type base layer 23 is located on the drift layer 22 and contacts the drift layer 22. The base layer 23 includes a $p^{+}$-type lower layer 23*a* and a p-type upper layer 23*b*. The lower layer 23*a* contacts the drift layer 22. The upper layer 23*b* is located on the lower layer 23*a*. The impurity concentration of the lower layer 23*a* is greater than the impurity concentration of the upper layer 23*b*.

The $n^{+}$-type source layer 24 is located on a portion of the base layer 23. The source layer 24 contacts the upper layer 23*b* of the base layer 23. Multiple source layers 24 are arranged along the X-direction. The source layers 24 extend in the Y-direction.

The source electrode 30 is located on the base layer 23 and on the source layer 24 and connected to the source layer 24 and the upper layer 23*b* of the base layer 23. The gate electrode 40 is located in the upper portion of the drift layer 22, inside the base layer 23, and inside the source layer 24. In other words, the gate electrode 40 extends through the source layer 24 and the base layer 23 in the Z-direction; and the lower end of the gate electrode 40 is positioned inside the upper portion of the drift layer 22.

The gate insulating film 50 covers the gate electrode 40 and contacts the gate electrode 40. The gate insulating film 50 is located between the drift layer 22 and the gate electrode 40, between the base layer 23 and the gate electrode 40, and between the source layer 24 and the gate electrode 40. A portion of the upper surface of the semiconductor part 20 is covered with the gate insulating film 50. The region of the upper surface of the semiconductor part 20 that is not covered with the gate insulating film 50 is slightly lower in the Z-direction compared to the region covered with the gate insulating film 50.

The $n^{-}$-type low-concentration layer 25 is located between the gate insulating film 50 and the drift layer 22, between the gate insulating film 50 and the base layer 23, and between the gate insulating film 50 and the source layer 24. The low-concentration layer 25 contacts the gate insulating film 50, the drift layer 22, the base layer 23, the source layer 24, and the source electrode 30. The impurity concentration of the low-concentration layer 25 is less than the impurity concentration of the drift layer 22. Also, the impurity concentration of the low-concentration layer 25 is less than the impurity concentration of the upper layer 23*b* of the base layer 23.

The $p^{++}$-type buried p-type layer 26 is located between the drain electrode 10 and the gate electrode 40, and is located directly under the low-concentration layer 25 inside the drift layer 22. The buried p-type layer 26 contacts the drift layer 22 and the low-concentration layer 25. The buried p-type layer 26 is separated from the gate insulating film 50 with the low-concentration layer 25 interposed. Thereby, the impurity concentration of the buried p-type layer 26 can be increased because there is no risk of introducing defects to the gate insulating film 50 even when the impurity concentration of the buried p-type layer 26 is high. The impurity concentration of the buried p-type layer 26 is greater than the impurity concentration of the upper layer 23*b* of the base layer 23. The buried p-type layer 26 is connected to the base layer 23 at a not-illustrated portion. Configurations that connect the buried p-type layer 26 to the base layer 23 are described in the third embodiment.

Examples of the impurity concentrations of the layers are as follows. The impurity concentration of the $n^{++}$-type drain layer 21 is, for example, $1\times10^{19}$ $cm^{-3}$. The impurity concentration of the $n^{-}$-type drift layer 22 is, for example, not less than 1×1015 $cm^{-3}$ and not more than 3×1016 $cm^{-3}$. The impurity concentration of the p-type base layer 23 is, for example, not less than $5\times10^{16}$ $cm^{-3}$ and not more than $1\times10^{19}$ $cm^{-3}$. The impurity concentration of the portion of the upper layer 23*b* of the base layer 23 next to the low-concentration layer 25 is, for example, $1\times10^{17}$ $cm^{-3}$. The impurity concentration of the $n^{+}$-type source layer 24 is, for example, not less than $5\times10^{16}$ $cm^{-3}$ and not more than $5\times10^{17}$ $cm^{-3}$.

The impurity concentration of the $n^{-}$-type low-concentration layer 25 is, for example, not less than $1\times10^{14}$ $cm^{-3}$ and not more than $1\times10^{15}$ $cm^{-3}$. The impurity concentration of the $p^{++}$-type buried p-type layer 26 is, for example, not less than $5\times10^{18}$ $cm^{-3}$ and not more than $2\times10^{19}$ $cm^{-3}$. As described above, the impurity concentration of the low-concentration layer 25 is less than the impurity concentration of the drift layer 22 and less than the impurity concentration of the upper layer 23*b* of the p-type base layer 23. The impurity concentration of the buried p-type layer 26 is greater than the impurity concentration of the upper layer 23*b* of the p-type base layer 23.

The thickness of the drift layer 22 is, for example, not less than 4 μm and not more than 50 μm. Thereby, the breakdown voltage of the semiconductor device 1 is, for example, not less than 650 V and not more than 6.5 kV. As the required breakdown voltage increases, it is necessary to reduce the impurity concentration of the drift layer 22 and increase the thickness of the drift layer 22. The thickness of the low-concentration layer 25 is, for example, not less than 10 nm and not more than 100 nm.

Operations of the semiconductor device 1 according to the embodiment will now be described.

Figure 2A:
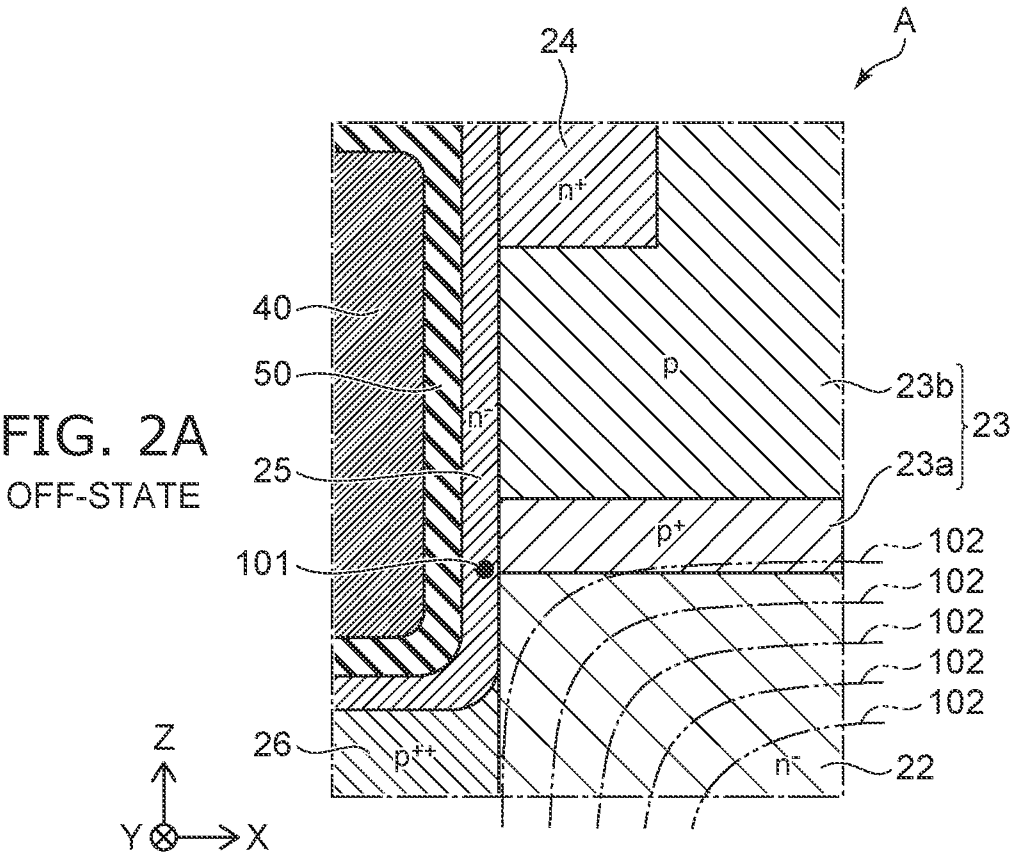
FIGS. 2A and 2B are cross-sectional views showing operations of the semiconductor device according to the first embodiment.
Figure 2B:
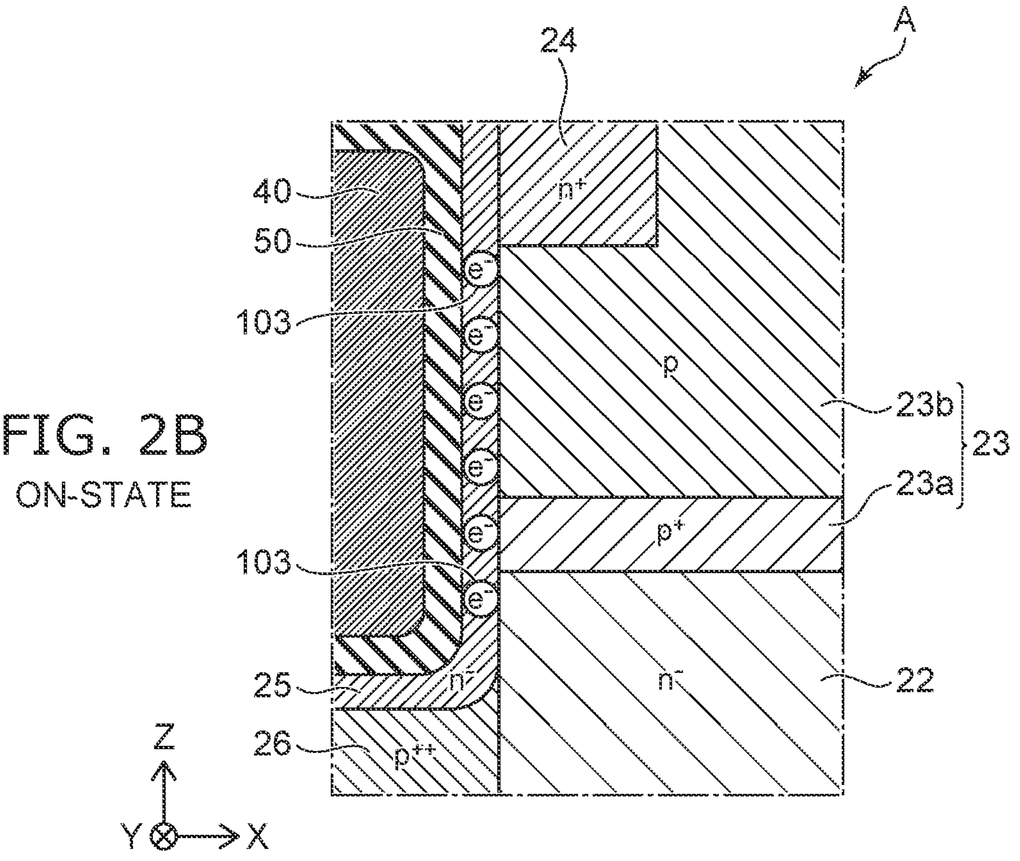

FIGS. 2A and 2B are cross-sectional views showing operations of the semiconductor device according to the embodiment.

FIGS. 2A and 2B show region A of FIG. 1. FIG. 2A shows the off-state, and FIG. 2B shows the on-state.

A voltage is applied between the drain electrode 10 and the source electrode 30 so that the drain electrode 10 is positive and the source electrode 30 is negative. In this state, when a voltage that is less than a threshold voltage is applied to the gate electrode 40 as shown in FIG. 2A, a depletion layer spreads with the interface between the $n^-$-type drift layer 22 and the p-type base layer 23 and the interface between the $n^-$-type drift layer 22 and the $p^{++}$-type buried p-type layer 26 as starting points. The $n^-$-type low-concentration layer 25, which is thin and has a low impurity concentration, also is depleted and does not conduct a current. Thereby, the semiconductor device 1 is set to the off-state.

At this time, because the impurity concentration of the buried p-type layer 26 is high, a large depletion layer extends into the drift layer 22 with the interface between the drift layer 22 and the buried p-type layer 26 as a starting point. The depletion layer at the vicinity of the buried p-type layer 26 is increased thereby, and the electric field strength is commensurately reduced. In particular, the spacing between equipotential lines 102 is wide and the electric field strength is low at the vicinity of a point 101 at which electric field concentration easily occurs. As a result, the electric field strength that is applied to the gate insulating film 50 also is reduced, and the reliability of the gate insulating film 50 is increased.

On the other hand, when a voltage that is greater than the threshold voltage is applied to the gate electrode 40 as shown in FIG. 2B, electrons 103 accumulate in the $n^-$-type low-concentration layer 25 to form a storage mode; and a current flows in the path of the drain electrode 10, the drain layer 21, the drift layer 22, the low-concentration layer 25, the source layer 24, and the source electrode 30. As a result, the semiconductor device 1 is switched to the on-state.

Manufacturing methods of the semiconductor device 1 according to the embodiment will now be described.

First, a first manufacturing method will be described.

FIGS. 3A to 3D show the first manufacturing method of the semiconductor device according to the embodiment.

First, an $n^{++}$-type silicon carbide wafer is prepared as shown in FIG. 1. The silicon carbide wafer is used to form the drain layer 21.

Then, as shown in FIG. 3A, an epitaxial layer 61 that is made of $n^-$-type silicon carbide is epitaxially grown using the upper surface of the drain layer 21 as a starting point. Then, the buried p-type layer 26 is formed by ion-implanting an impurity that forms acceptors into a portion of the upper layer portion of the epitaxial layer 61. The buried p-type layer 26 is formed in a band shape extending in the Y-direction.

Continuing as shown in FIG. 3B, an epitaxial layer 62 is formed on the epitaxial layer 61. The conductivity types of the epitaxial layer 62 are the $n^-$-type, $p^+$-type, and p-type in this order from the lower layer side. The portion of the epitaxial layer 61 other than the buried p-type layer 26 and the $n^-$-type portion of the epitaxial layer 62 are used to form the drift layer 22; the $p^+$-type portion of the epitaxial layer 62 is used to form the lower layer 23*a* of the base layer 23; and the p-type portion of the epitaxial layer 62 is used to form the upper layer 23*b* of the base layer 23. The entire epitaxial layer 62 may be formed as the $n^-$-type, after which the $p^+$-type portions and the p-type portions may be formed by ion implantation.

Then, as shown in FIG. 3C, the $n^+$-type source layer 24 is formed in a portion of the upper layer portion of the epitaxial layer 62. Then, a trench 63 is formed in the region of the epitaxial layer 62 directly above the buried p-type layer 26. The trench 63 extends through the source layer 24 and reaches the buried p-type layer 26.

Continuing as shown in FIG. 3D, a thin $n^-$-type layer 64 is formed on the entire surface. The thickness of the $n^-$-type layer 64 is set to 10 nm to 100 nm. The portion of the $n^-$-type layer 64 formed on the inner surface of the trench 63 is used to form the low-concentration layer 25.

Then, as shown in FIG. 1, the gate insulating film 50 and the gate electrode 40 are formed inside the trench 63. Heat treatment for activating the ion-implanted impurities is performed as appropriate. Then, the drain electrode 10 is formed on the lower surface of the drain layer 21; and the source electrode 30 is formed on the epitaxial layer 62 and on the gate insulating film 50. Then, the silicon carbide wafer is singulated by dicing. Thus, the semiconductor device 1 is manufactured.

A second manufacturing method will now be described.

FIGS. 4A to 4D show the second manufacturing method of the semiconductor device according to the embodiment.

The same Z-direction position is shown by broken lines in FIGS. 4A to 4D for convenience.

A description of the second manufacturing method is omitted for portions similar to the first manufacturing method.

As shown in FIG. 4A, an epitaxial layer 66 is epitaxially grown on the drain layer 21. The drift layer 22, the lower layer 23*a* of the base layer 23, the upper layer 23*b*, and the source layer 24 are formed in the epitaxial layer 66.

Then, as shown in FIG. 4B, the trench 63 is formed in the epitaxial layer 66. The trench 63 extends through the source layer 24 and the base layer 23 and reaches the upper layer portion of the drift layer 22.

Continuing as shown in FIG. 4C, the buried p-type layer 26 is formed by ion-implanting an impurity that forms acceptors into the bottom surface of the trench 63.

Then, as shown in FIG. 4D, the thin $n^-$-type layer 64 is formed on the entire surface. The subsequent processes are the same as those of the first manufacturing method.

Effects of the embodiment will now be described.

According to the embodiment, the low-concentration layer 25 that contacts the gate insulating film 50 is included. Because the gate insulating film 50 contacts the low-concentration layer 25 having the low impurity concentration, the introduction of defects to the gate insulating film 50 can be suppressed, and the reliability of the gate insulating film 50 can be increased. If a gate insulating film that includes silicon oxide contacts a high-concentration layer having a high impurity concentration, the reliability life of the gate insulating film is reduced. According to the embodiment, this problem is solved by providing the gate insulating film 50 in contact with the low-concentration layer 25; 25 and the reliability of the gate insulating film 50 is increased.

According to the embodiment, the buried p-type layer 26 is separated from the gate insulating film 50 with the low-concentration layer 25 interposed. Therefore, the impurity concentration of the buried p-type layer 26 can be increased, and the depletion layer at the periphery of the buried p-type layer 26 can be thick when the semiconductor device 1 is in the off-state. As a result, the electric field that is applied to the gate insulating film 50 is reduced, and damage of the gate insulating film 50 can be suppressed. In other words, the reliability of the gate insulating film 50 can be increased.

To suppress the electric field applied to the bottom portion, and particularly the corner portion of the gate insulating film 50, it is favorable to increase the impurity concentration of the buried p-type layer 26. If, however, the low-concentration layer 25 is not included and the buried p-type layer 26 contacts the gate insulating film 50, the reliability life of the gate insulating film 50 is reduced when the impurity concentration of the buried p-type layer 26 is increased as described above. Therefore, unfortunately, the impurity concentration of the buried p-type layer 26 cannot be increased. According to the embodiment, by interposing the low-concentration layer 25 between the gate insulating film 50 and the buried p-type layer 26, the problem described above can be avoided, and the impurity concentration of the buried p-type layer 26 can be increased while ensuring the reliability life of the gate insulating film 50. The electric field that is applied to the bottom portion, and particularly the corner portion of the gate insulating film 50, can be suppressed thereby, and breakdown of the gate insulating film 50 can be suppressed.

Second Embodiment

Figure 5:
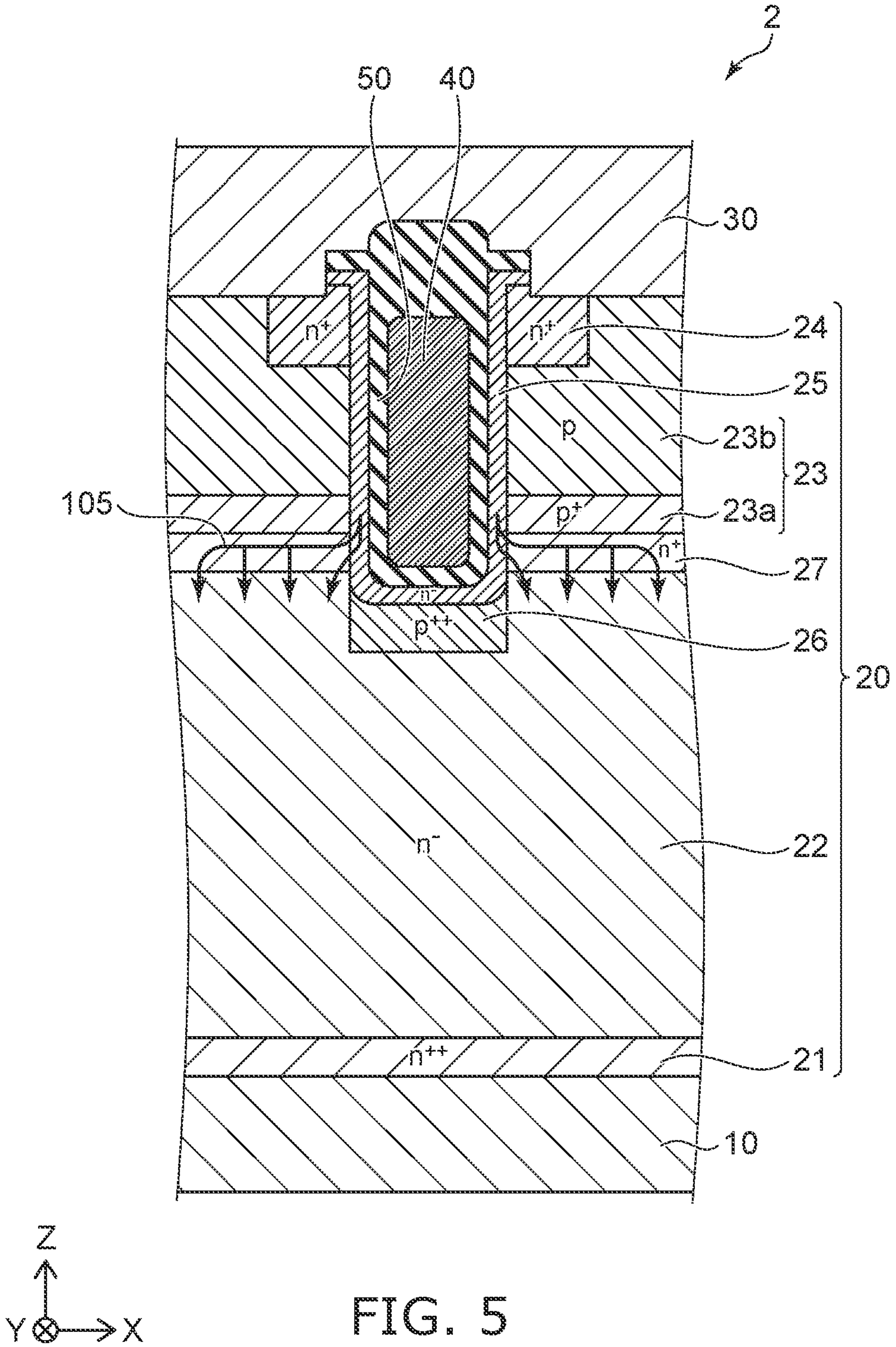
FIG. 5 is a cross-sectional view showing a semiconductor device according to a second embodiment.

FIG. 5 is a cross-sectional view showing a semiconductor device according to the embodiment.

As shown in FIG. 5, in addition to the configuration of the semiconductor device 1 according to the first embodiment, a deep n-type layer 27 (a third layer) is included in the semiconductor part 20 of the semiconductor device 2 according to the embodiment.

The conductivity type of the deep n-type layer 27 is the $n^+$-type; and the impurity concentration of the deep n-type layer 27 is greater than the impurity concentration of the drift layer 22. The impurity concentration of the deep n-type layer 27 is, for example, not less than $5\times10^{16}$ $cm^{-3}$ and not more than $5\times10^{17}$ $cm^{-3}$. The deep n-type layer 27 is located between the drift layer 22 and the base layer 23 and spreads along the XY plane. The deep n-type layer 27 contacts the drift layer 22, the lower layer 23*a* of the base layer 23, and the low-concentration layer 25. The deep n-type layer 27 may be in contact with or separated from the buried p-type layer 26.

In the semiconductor device 2 according to the embodiment, an electron current 105 that passes through the low-concentration layer 25 in the storage mode of the on-state diffuses in the X-direction via the deep n-type layer 27. The current that flows in the drift layer 22 is made uniform thereby, and the on-resistance is reduced. Otherwise, the configuration, the operations, and the effects of the embodiment are similar to those of the first embodiment.

Third Embodiment

The embodiment is an example in which a wider region of the semiconductor device according to the second embodiment is described.

Figure 6:
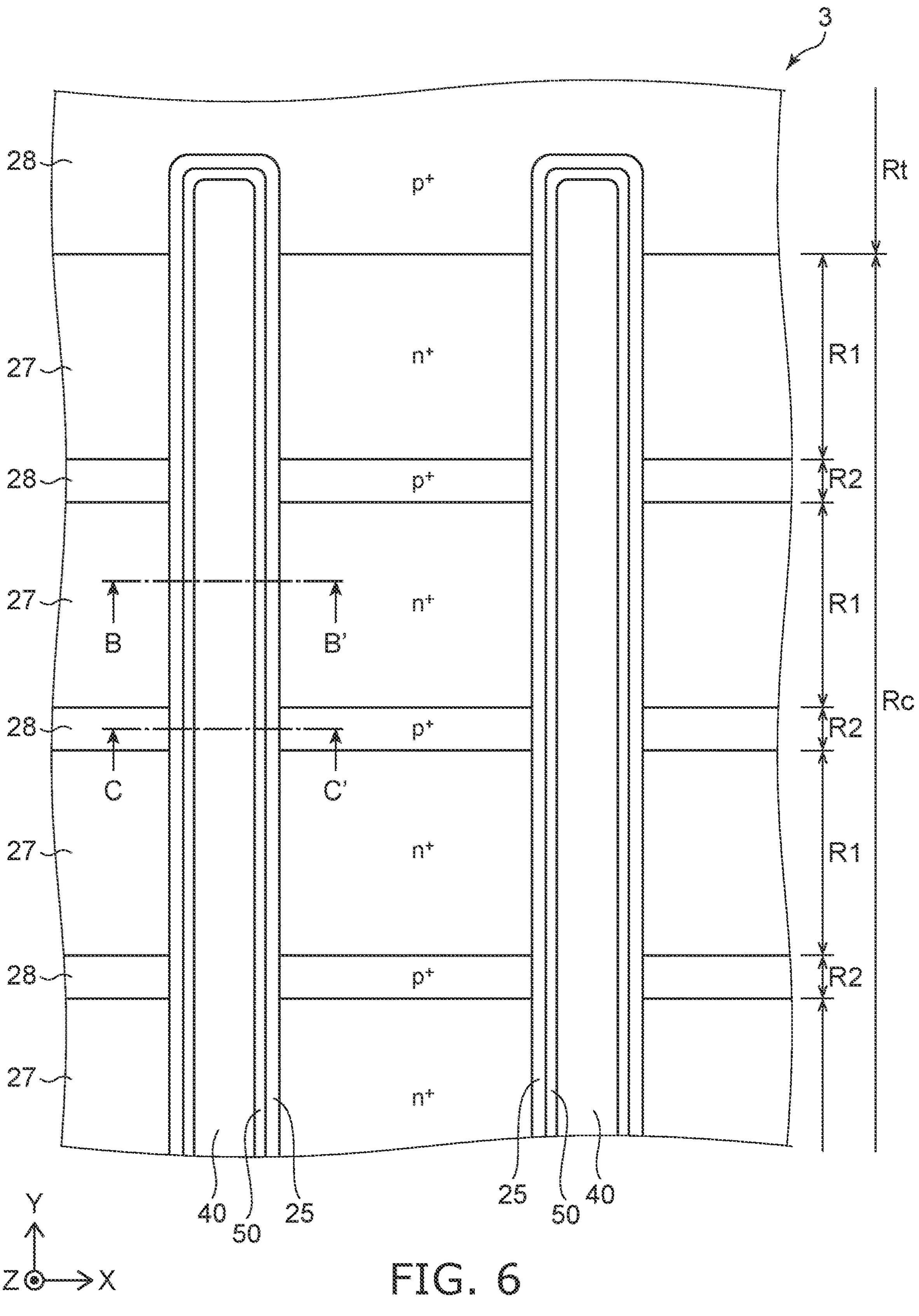
FIG. 6 is a plan view showing a semiconductor device according to a third embodiment.

FIG. 6 is a plan view showing the semiconductor device according to the embodiment.

Figures 7A, 7B:
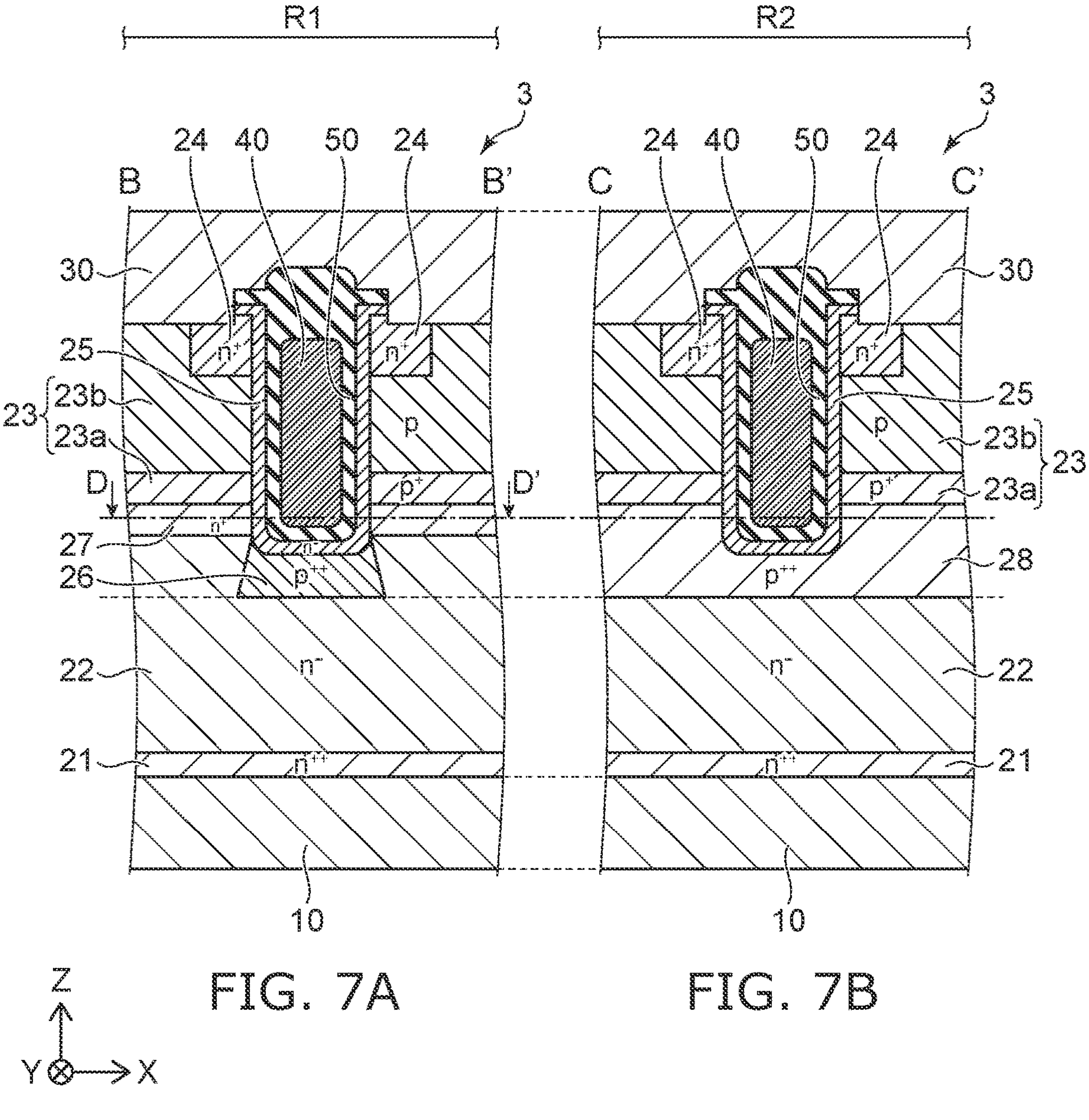
FIG. 7A is a cross-sectional view along line B-B' shown in FIG. 6.
FIG. 7B is a cross-sectional view along line C-C' shown in FIG. 6.

FIG. 7A is a cross-sectional view along line B-B' shown in FIG. 6; and FIG. 7B is a cross-sectional view along line C-C' shown in FIG. 6.

The plane shown in FIG. 6 corresponds to the cross section along line D-D' shown in FIGS. 7A and 7B. The same Z-direction position is shown by multiple broken lines in FIGS. 7A and 7B for convenience.

As shown in FIG. 6, a cell region Rc and a termination region Rt are set in the semiconductor device 3 according to the embodiment. Although FIG. 6 is a partial enlarged plan view of the semiconductor device 3, in the entire plane of the semiconductor device 3, the cell region Rc is located at the central part of the semiconductor device 3; and the termination region Rt surrounds the cell region Rc. A transistor region R1 and a connection region R2 are set in the cell region Rc. Multiple transistor regions R1 and multiple connection regions R2 are alternately arranged along the Y-direction and are, for example, periodically arranged.

A connection layer 28 is located in the connection region R2 of the cell region Rc. The connection layer 28 also is located in the termination region Rt. The conductivity type of the connection layer 28 is the $p^+$-type; and the impurity concentration of the connection layer 28 is, for example, not less than $5\times10^{18}$ $cm^{-3}$ and not more than $2\times10^{19}$ $cm^{-3}$. As shown in FIG. 7B, the connection layer 28 is located between the drift layer 22 and the base layer 23 and contacts the drift layer 22, the low-concentration layer 25, and the base layer 23. The connection layer 28 covers the two Y-direction end portions of the low-concentration layer 25 when viewed from above. The deep n-type layer 27 is not provided in the connection region R2 and the termination region Rt of the cell region Rc.

On the other hand, in the transistor region R1 of the cell region Rc, the lower layer 23*a* of the base layer 23, the buried p-type layer 26, and the deep n-type layer 27 are included, but the connection layer 28 is not included. Because the transistor region R1 and the connection region R2 are located next to each other, the connection layer 28 also contacts the buried p-type layer 26 and the deep n-type layer 27. Thereby, the connection layer 28 connects the buried p-type layer 26 to the base layer 23.

A manufacturing method of the semiconductor device according to the embodiment will now be described.

FIGS. 8A to 8D show the manufacturing method of the semiconductor device according to the embodiment.

FIGS. 8A and 8B show the same process; and FIGS. 8C and 8D show the same process. FIGS. 8A and 8C show the transistor region R1; and FIGS. 8B and 8D show the connection region R2.

As shown in FIGS. 8A and 8B, the first level, i.e., an epitaxial layer 67, is epitaxially grown on the drain layer 21. The conductivity type of the epitaxial layer 67 is the $n^-$-type. Then, an impurity that forms donors or acceptors is ion-implanted into the upper layer portion of the epitaxial layer 67. At this time, in the transistor region R1 as shown in FIG. 8A, the deep n-type layer 27 is formed by setting the upper layer portion of the epitaxial layer 67 to the $n^+$-type. In the connection region R2 as shown in FIG. 8B, the connection layer 28 is formed by setting the upper layer portion of the epitaxial layer 67 to the $p^+$-type. The connection layer 28 is formed deeper than the deep n-type layer 27. The portion of the epitaxial layer 67 other than the deep n-type layer 27 and the connection layer 28 is used to form the drift layer 22.

Then, as shown in FIGS. 8C and 8D, the second level, i.e., an epitaxial layer 68, is epitaxially grown on the epitaxial layer 67. The conductivity type of the epitaxial layer 68 is the p-type. However, the conductivity type of the lowermost layer of the epitaxial layer 68 is set to the $p^+$-type; and the lowermost layer of the epitaxial layer 68 is used to form the lower layer 23*a* of the base layer 23. The portion of the epitaxial layer 68 other than the lower layer 23*a* is used to form the upper layer 23*b* of the base layer 23. Then, a trench 69 is formed in the epitaxial layers 67 and 68. The trench 69 extends through the epitaxial layer 68 in the Z-direction and reaches the upper layer portion of the epitaxial layer 67. Thereafter, the manufacturing method is similar to that of the first embodiment.

According to the embodiment, the $p^+$-type connection layer 28 connects the buried p-type layer 26 to the base layer 23. Therefore, the buried p-type layer 26 is connected to the source electrode 30 via the connection layer 28 and the base layer 23. Thereby, a constant potential can be uniformly applied to the buried p-type layer 26; and the depletion layer in the off-state can uniformly expand. Therefore, the electric field distribution in the off-state can be made uniform, and the reliability of the gate insulating film 50 can be further increased. Otherwise, the configuration, the operations, and the effects according to the embodiment are similar to those of the second embodiment.

Fourth Embodiment

Figure 9:
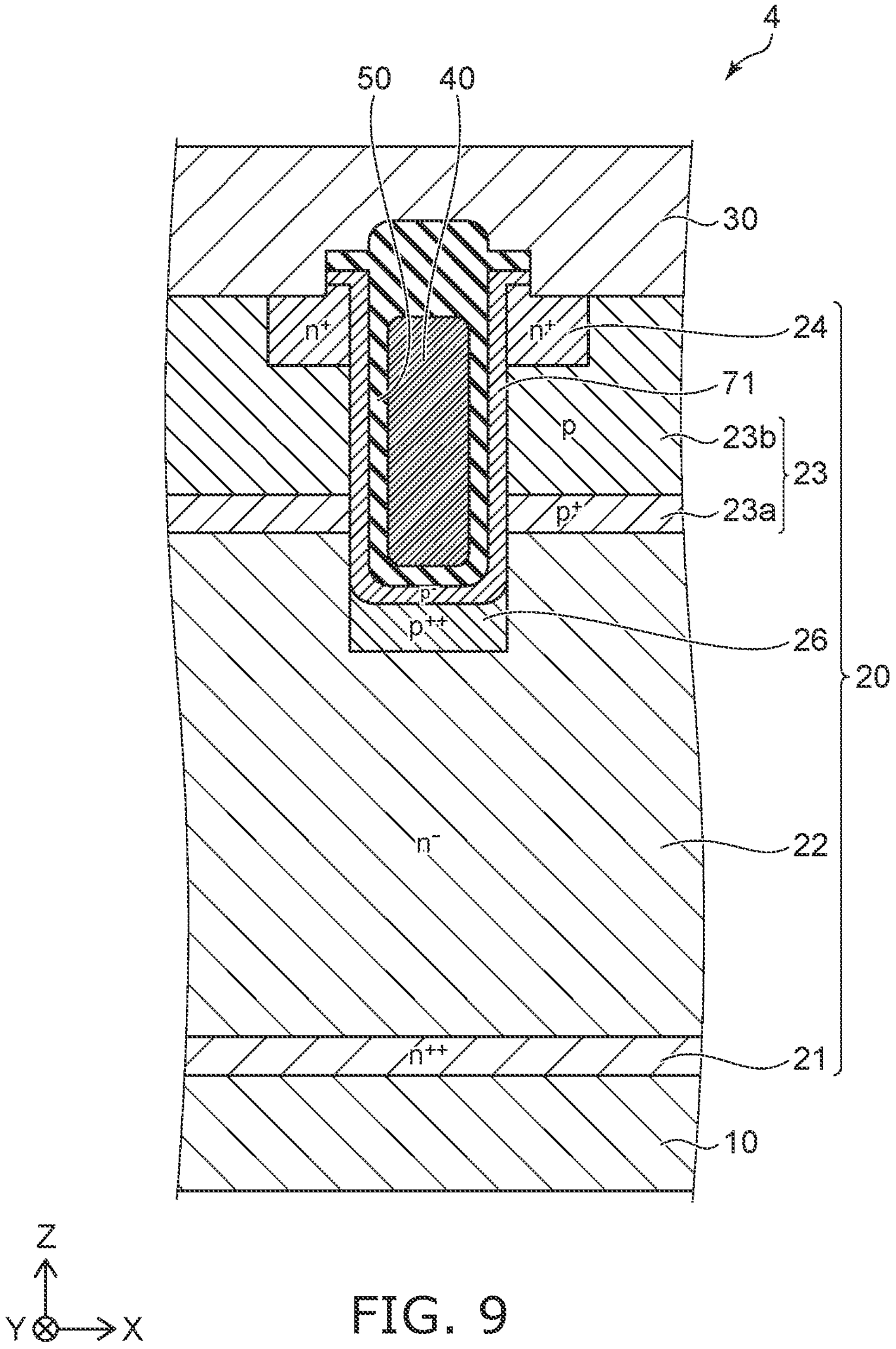
FIG. 9 is a cross-sectional view showing a semiconductor device according to a fourth embodiment.

FIG. 9 is a cross-sectional view showing a semiconductor device according to the embodiment.

As shown in FIG. 9, the semiconductor device 4 according to the embodiment differs from the semiconductor device 1 according to the first embodiment (see FIG. 1) in that the conductivity type of the low-concentration layer is the $p^-$-type. Namely, the semiconductor device 4 includes a low-concentration layer 71 of the $p^-$-conductivity type instead of the low-concentration layer 25 of the semiconductor device 1.

In the semiconductor device 4 according to the embodiment, an inversion layer is formed in the low-concentration layer 71 in the on-state; and conduction is performed in the inversion mode. On the other hand, in the off-state, a depletion layer spreads with the interface between the drift layer 22 and the base layer 23 as a starting point. At this time, leakage current can be more reliably suppressed because an $n^-$-type low-concentration layer does not exist.

According to the embodiment as well, the reliability of the gate insulating film 50 is high because the gate insulating film 50 contacts the low-concentration layer 71 that has a low impurity concentration. Furthermore, because the buried p-type layer 26 is separated from the gate insulating film 50 with the low-concentration layer 71 interposed, the impurity concentration of the buried p-type layer 26 can be increased while suppressing damage to the gate insulating film 50. Otherwise, the configuration, the operations, and the effects according to the embodiment are similar to those of the first embodiment.

Fifth Embodiment

Figure 10:
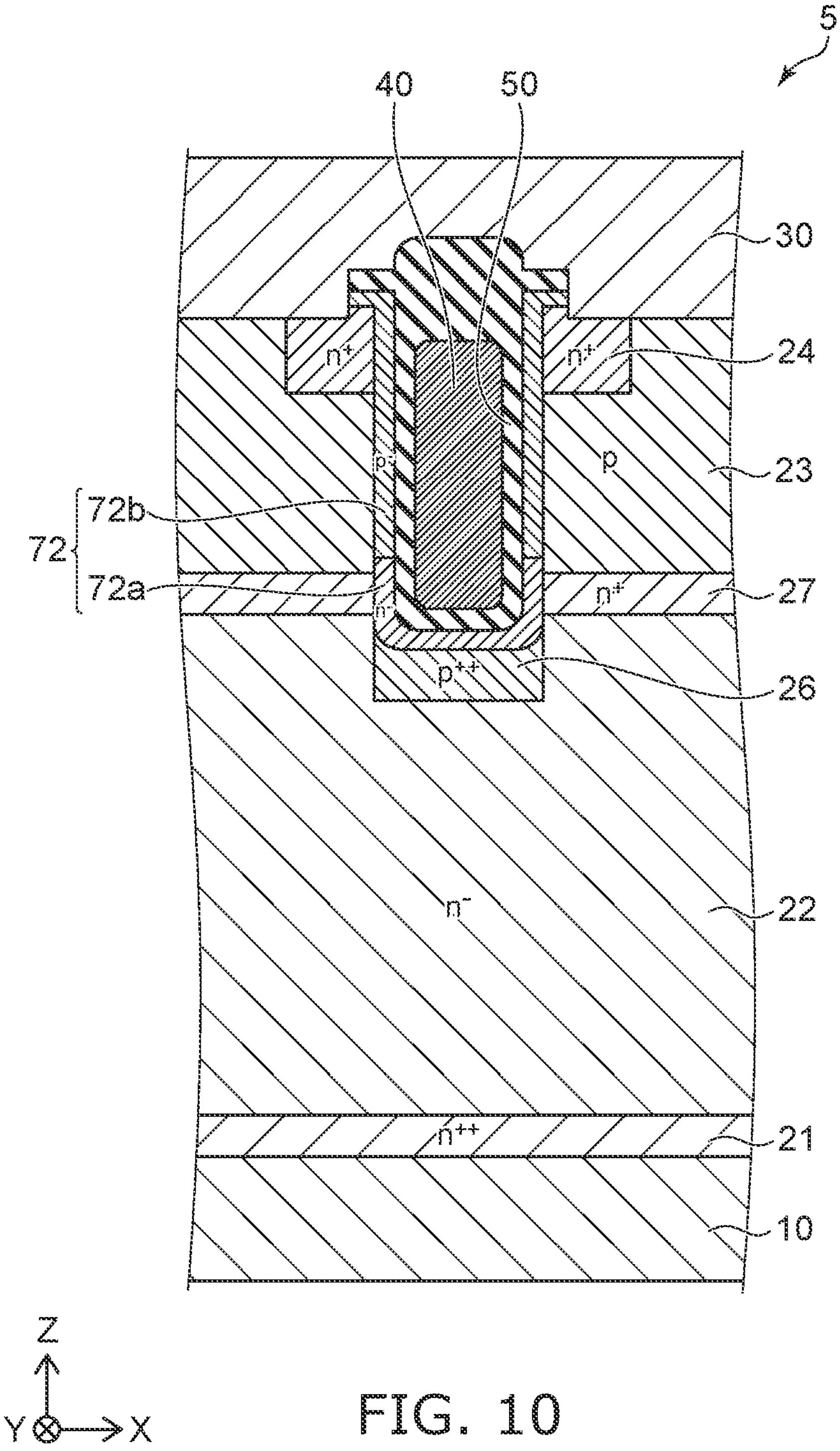
FIG. 10 is a cross-sectional view showing a semiconductor device according to a fifth embodiment.

FIG. 10 is a cross-sectional view showing a semiconductor device according to the embodiment.

As shown in FIG. 10, the conductivity type of the low-concentration layer of the semiconductor device 5 according to the embodiment is different from that of the semiconductor device 2 according to the second embodiment (see FIG. 5). Also, according to the embodiment, the base layer 23 has a p-type single-layer structure instead of a two-layer structure made of a lower layer and an upper layer.

Namely, the semiconductor device 5 includes a low-concentration layer 72 instead of the low-concentration layer 25 of the semiconductor device 2. The low-concentration layer 72 includes an $n^-$-type lower portion **72*a* and a $p^-$-type upper portion 72*b*. The lower portion 72*a* contacts the gate insulating film 50, the buried p-type layer 26, the drift layer 22, the deep n-type layer 27, and the base layer 23. The upper portion 72*b* is located on the lower portion 72*a* and contacts the gate insulating film 50, the base layer 23, and the source layer 24**. Otherwise, the configuration, the operations, and the effects according to the embodiment are similar to those of the second embodiment.

Sixth Embodiment

Figure 11:
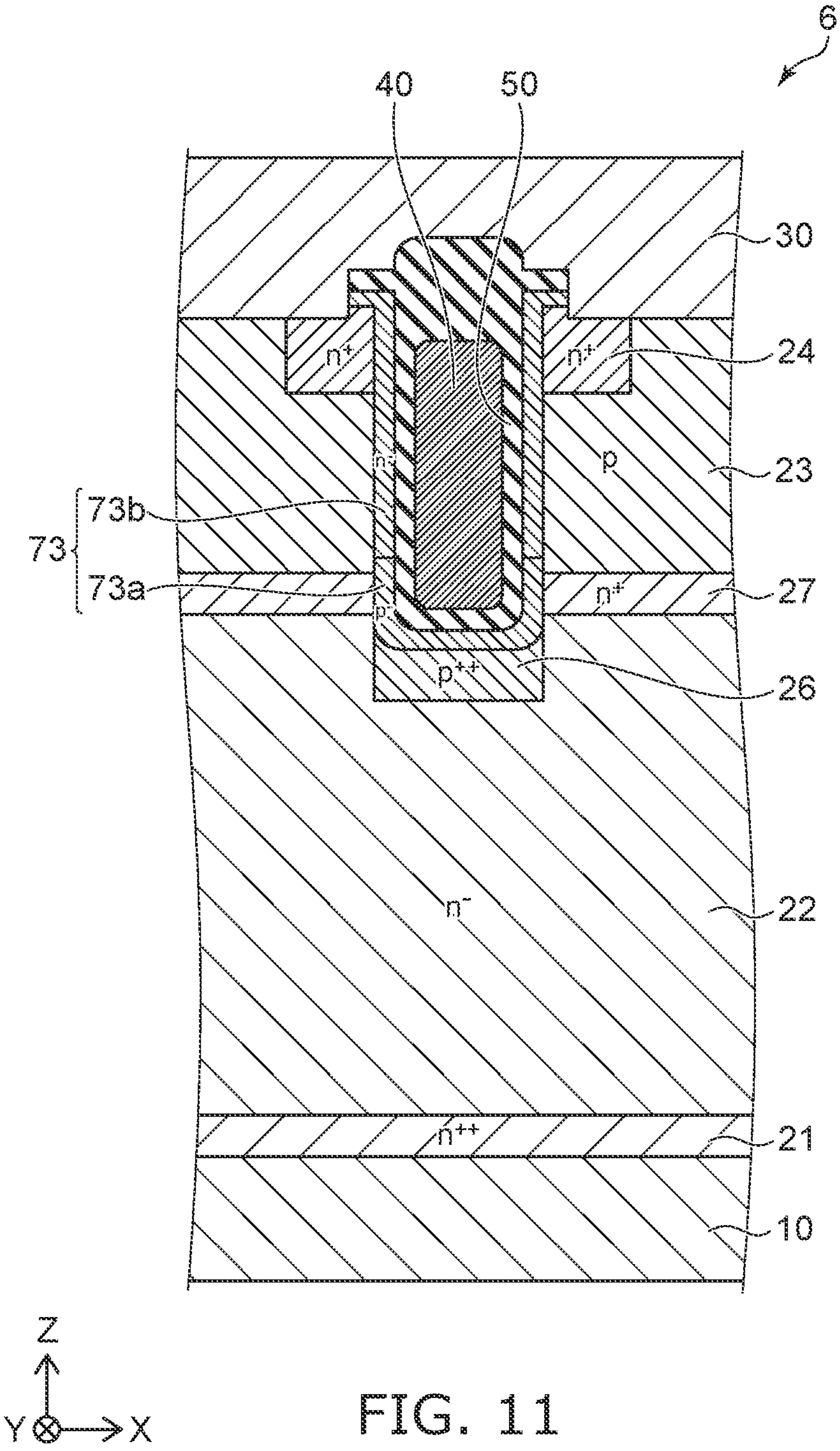
FIG. 11 is a cross-sectional view showing a semiconductor device according to a sixth embodiment.

FIG. 11 is a cross-sectional view showing a semiconductor device according to the embodiment.

As shown in FIG. 11, the conductivity types of the upper portion and the lower portion of the low-concentration layer of the semiconductor device 6 according to the embodiment are the opposite of those of the semiconductor device 5 according to the fifth embodiment.

Namely, the semiconductor device 6 includes a low-concentration layer 73 instead of the low-concentration layer 72 of the semiconductor device 5. The low-concentration layer 73 includes a $p^-$-type lower portion **73*a* and an $n^-$-type upper portion 73*b*. The lower portion 73*a* contacts the gate insulating film 50, the buried p-type layer 26, the drift layer 22, and the deep n-type layer 27. However, the lower portion 73*a* also may contact the base layer 23. The upper portion 73*b* is located on the lower portion 73*a* and contacts the gate insulating film 50, the base layer 23, and the source layer 24**. Otherwise, the configuration, the operations, and the effects according to the embodiment are similar to those of the fifth embodiment.

Seventh Embodiment

Figure 12:
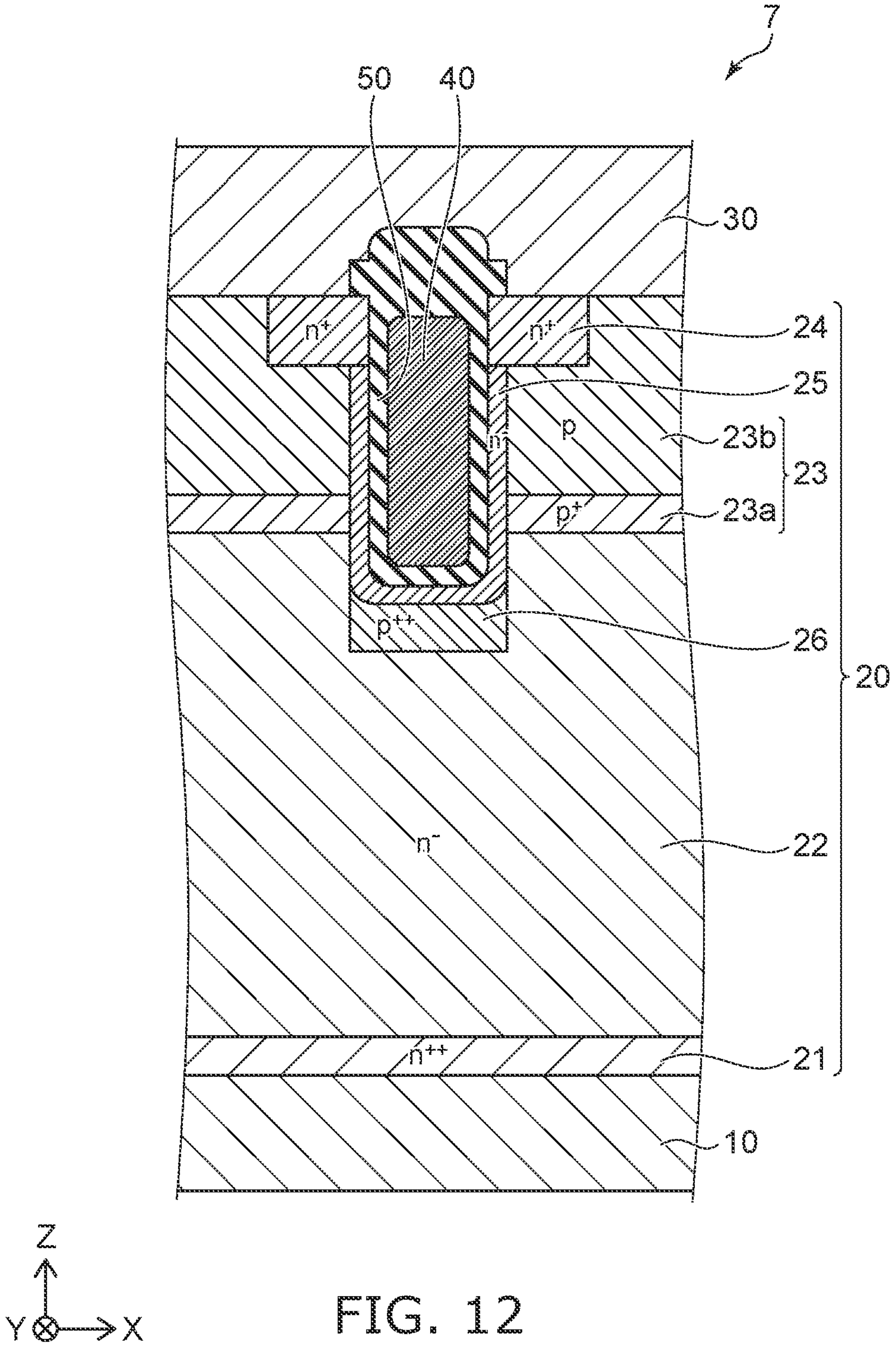
FIG. 12 is a cross-sectional view showing a semiconductor device according to a seventh embodiment.

FIG. 12 is a cross-sectional view showing a semiconductor device according to the embodiment.

As shown in FIG. 12, the positional relationship of the gate insulating film 50, the source layer 24, and the low-concentration layer 25 of the semiconductor device 7 according to the embodiment is different from that of the semiconductor device 1 according to the first embodiment. Namely, the source layer 24 is located on the low-concentration layer 25 and contacts the gate insulating film 50 and the low-concentration layer 25. The low-concentration layer 25 is separated from the source electrode 30 and connected to the source electrode 30 via the source layer 24. Effects similar to the first embodiment can be obtained thereby. Otherwise, the configuration, the operations, and the effects according to the embodiment are similar to those of the first embodiment.

According to the embodiments described above, a semiconductor device can be realized in which breakdown of the gate insulating film can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:

a first electrode;

a first semiconductor layer connected to the first electrode, the first semiconductor layer including silicon carbide, the first semiconductor layer being of a first conductivity type;

a second semiconductor layer located on the first semiconductor layer, the second semiconductor layer including silicon carbide, the second semiconductor layer being of a second conductivity type;

a third semiconductor layer located on a portion of the second semiconductor layer, the third semiconductor layer including silicon carbide, the third semiconductor layer being of the first conductivity type;

a second electrode connected to the second and third semiconductor layers;

a third electrode located among the first semiconductor layer, the second semiconductor layer, and the third semiconductor layer;

an insulating film located between the third electrode and the second semiconductor layer and between the third electrode and the third semiconductor layer, in a first direction perpendicular to a second direction from the first electrode to the second electrode; and a fourth semiconductor layer located between the insulating film and the first semiconductor layer and between the insulating film and the second semiconductor layer, the fourth semiconductor layer contacting the insulating film and including silicon carbide, an impurity concentration of the fourth semiconductor layer being less than an impurity concentration of the first semiconductor layer and an impurity concentration of the second semiconductor layer, wherein the third electrode extends in a third direction perpendicular to the first direction and the second direction, a length of the third electrode in the third direction is longer than a length of the third electrode in the first direction, the fourth semiconductor layer covers an end portion of the third electrode in the third direction, the first semiconductor layer includes:

a first layer contacting the first electrode;

a second layer located on the first layer, an impurity concentration of the second layer being less than an impurity concentration of the first layer; and a third layer located on the second layer, the third layer contacting the second and fourth semiconductor layers, an impurity concentration of the third layer being greater than the impurity concentration of the second layer, the semiconductor device has, in a cross-sectional view in the second direction, a cell region in which a plurality of transistor sub-regions, each of which is formed with the third layer of the first semiconductor layer and extends in the first direction, are arranged in the third direction with an interval formed with a connection layer of the second conductivity type and a termination region that is formed with the connection layer of the second conductivity type and surrounds the cell region and in which no transistor sub-region is provided, and the end portion of the third electrode in the third direction is located in the termination region.

2. The device according to claim 1, further comprising:

a fifth semiconductor layer located between the first electrode and the third electrode, the fifth semiconductor layer contacting the first and fourth semiconductor layers, the fifth semiconductor layer being of the second conductivity type, an impurity concentration of the fifth semiconductor layer being greater than the impurity concentration of the second semiconductor layer, wherein the fifth semiconductor layer is separated from the insulating film with the fourth semiconductor layer therebetween.

3. The device according to claim 2, wherein an impurity concentration of the fifth semiconductor layer is not less than $5\times10^{18}$ $cm^{-3}$ and not more than $2\times10^{19}$ $cm^{-3}$.

4. The device according to claim 2, further comprising:

a plurality of connection layers arranged along a direction in which the third electrode extends, the plurality of connection layers contacting the second semiconductor layer, the plurality of connection layers being of the second conductivity type.

5. The device according to claim 1, wherein the second semiconductor layer includes:

a lower layer contacting the first semiconductor layer; and an upper layer contacting the third semiconductor layer, and an impurity concentration of the upper layer is less than an impurity concentration of the lower layer.

6. The device according to claim 1, wherein the fourth semiconductor layer is of the first conductivity type.

7. The device according to claim 1, wherein the fourth semiconductor layer is of the second conductivity type.

8. The device according to claim 1, wherein the fourth semiconductor layer includes:

a lower portion contacting the first semiconductor layer, the lower portion being of the first conductivity type; and an upper portion contacting the second semiconductor layer, the upper portion being of the second conductivity type.

9. The device according to claim 1, wherein the fourth semiconductor layer includes:

a lower portion contacting the first semiconductor layer, the lower portion being of the second conductivity type; and an upper portion contacting the second semiconductor layer, the upper portion being of the first conductivity type.

10. The device according to claim 1, wherein the third semiconductor layer contacts the insulating film and the fourth semiconductor layer, and the fourth semiconductor layer is separated from the second electrode.

11. The device according to claim 1, wherein the fourth semiconductor layer is located also between the insulating film and the third semiconductor layer, and the third semiconductor layer is separated from the insulating film.

12. The device according to claim 1, wherein the first semiconductor layer includes:

a first layer contacting the first electrode; and a second layer located on the first layer, an impurity concentration of the second layer being less than an impurity concentration of the first layer, and the impurity concentration of the second layer is not less than $1\times10^{15}$ $cm^{-3}$ and not more than $3\times10^{16}$ $cm^{-3}$.

13. The device according to claim 1, wherein the impurity concentration of the second semiconductor layer is not less than $5\times10^{16}$ $cm^{-3}$ and not more than $1\times10^{19}$ $cm^{-3}$.

14. The device according to claim 1, wherein an impurity concentration of the third semiconductor layer is not less than $5\times10^{16}$ $cm^{-3}$ and not more than $5\times10^{17}$ $cm^{-3}$.

15. The device according to claim 1, wherein the impurity concentration of the fourth semiconductor layer is not less than $1\times10^{14}$ $cm^{-3}$ and not more than $1\times10^{15}$ $cm^{-3}$.

16. The device according to claim 1, wherein a thickness of the fourth semiconductor layer is not less than 10 nm and not more than 100 nm.

17. The device according to claim 1, wherein in the cross-sectional view in the second direction, the insulating film is provided between the end portion of the third electrode and the fourth semiconductor layer in the third direction, in the termination region.

18. The device according to claim 1, wherein portions of the fourth semiconductor layer cover both end portions of the third electrode in the third direction in the termination region.

* * * * *